(12) United States Patent
Larraza et al.

(10) Patent No.: US 9,960,715 B1
(45) Date of Patent: May 1, 2018

(54) LIGHT ACTIVATED PIEZOELECTRIC CONVERTER

(71) Applicant: The United States of America, as represented by the Secretary of the Navy, Washington, DC (US)

(72) Inventors: Andres Larraza, Salinas, CA (US); David M. Wolfe, Texarkana, TX (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 231 days.

(21) Appl. No.: 15/147,568

(22) Filed: May 5, 2016

Related U.S. Application Data

(63) Continuation-in-part of application No. 15/093,047, filed on Apr. 7, 2016, now Pat. No. 9,822,786.

(60) Provisional application No. 62/311,704, filed on Mar. 22, 2016.

(51) Int. Cl.
  *H01L 41/113* (2006.01)
  *H02N 2/18* (2006.01)
(52) U.S. Cl.
  CPC ......... *H02N 2/181* (2013.01); *H01L 41/1136* (2013.01)
(58) Field of Classification Search
  CPC .............. H01L 41/113; H01L 41/1132; H01L 41/1134; H01L 41/1136; H01L 41/1138; H02N 2/18
  USPC ................................................. 310/306, 339
  See application file for complete search history.

(56) References Cited

U.S. PATENT DOCUMENTS

| | | | |
|---|---|---|---|
| 4,397,150 A | 8/1983 | Paller | |
| 4,410,805 A | 10/1983 | Berley | |
| 4,926,037 A | 5/1990 | Martin-Lopez | |
| 5,611,208 A | 3/1997 | Hemmerich et al. | |
| 5,780,727 A | 7/1998 | Gimzewski et al. | |
| 5,871,336 A | 2/1999 | Young | |
| 6,453,748 B1 | 9/2002 | Pryor | |
| 7,104,134 B2 | 9/2006 | Amano et al. | |
| 7,521,841 B2 | 4/2009 | Clingman et al. | |
| 7,687,977 B2 | 3/2010 | Xu | |

(Continued)

OTHER PUBLICATIONS

Scandurra et al., "Gas kinetic forces on thin plates in the presence of thermal gradients," Physical Review E 75(2) (2007).

(Continued)

*Primary Examiner* — Derek Rosenau
(74) *Attorney, Agent, or Firm* — Naval Postgraduate School; James B. Potts

(57) ABSTRACT

Provided is a light activated piezoelectric converter comprising a cantilever vane coupled to a foundation. The vane comprises a first surface and a second surface. The first and second surfaces are generally co-planer and adjacent to a common boundary and have differing emissivities. A piezoelectric material is additionally coupled to the vane, arranged such that a deflection of the free end of the vane generates stress acting on the piezoelectric material. When the piezoelectric converter is illuminated with a radiant flux, the differing emissivities of the first and second surfaces produce a temperature gradient across the vane and a thermal creep force across the planar surface generates a deflection of the vane, and a subsequent voltage induced by the stress on the piezoelectric material generates a voltage between a first electrode and second electrode in electrical contact with the piezoelectric material.

18 Claims, 5 Drawing Sheets

(56) References Cited

U.S. PATENT DOCUMENTS

| | | |
|---|---|---|
| 7,777,396 B2 | 8/2010 | Rastegar et al. |
| 8,235,675 B2 | 8/2012 | Gianchandani et al. |
| 9,106,112 B2 | 8/2015 | Farquharson et al. |
| 2015/0013337 A1 | 1/2015 | Nutter et al. |

OTHER PUBLICATIONS

Chen et al., "The dynamic mechanism of a moving Crookes radiometer," Phys. Fluids 24 (2012).

Seldon et al., "Experimental and Computational Study of Area and Perimeter Contributions to Radiometer Forces," School of Aeronautics and Astronautics Faculty Publications. Paper 20. http://dx.doi.org/10.1063/1.3076616 (accessed Apr. 1, 2016).

Shida et al., "Maxwell's Thermal Creep in Two Space Dimensions," Journal of the Physical Society of Japan, 67(7) (1998).

Wadsworth et al., "A Computational Study of Radiometric Phenomena for Powering Microactuators with Unlimited Displacements and Large Available Forces," Journal of Microelectromechanical Systems, 5(1) (1996).

Alexeenko et al, "Low Speed Nano/Micro/Meso-Scale Rarefied Flows Driven by Temperature and Pressure Gradients," Rarified Gas Dynamics, pp. 1085-1092 (2007).

Scandurra, "Enhanced Radiometric Forces," http://arXiv:physics/0402011 [physics.class-ph] (accessed Apr. 1, 2016).

Wolfe et al., "A horizontal vane radiometer: Experiment, theory,and simulation,"Physics of Fluids 28 (2016).

Ferrari et al., "Piezoelectric multifrequency energy converter for power harvesting in autonomous microsystems," Sensors and Actuators A 142 (2008).

Guan et al., "Characteristics of Energy Storage Devices in Piezoelectric Energy Harvesting Systems," Journal of Intelligent Material Systems and Structures 19 (2008).

Ottman et al, "Adaptive Piezoelectric Energy Harvesting Circuit for Wireless Remote Power Supply," IEEE Transactions on Power Electronics 17(5) (2002).

Ottman et al., "Optimized Piezoelectric Energy Harvesting Circuit Using Step-Down Converter in Discontinuous Conduction Mode," IEEE Transactions on Power Electronics 18(2) (2003).

Devoe et al.,"Modeling and Optimal Design of Piezoelectric Cantilever Microactuators,"Journal of Microelectromechanical Systems, 6(3) (1997).

Lui et al.,"A MEMS-based piezoelectric power generator array for vibration energy harvesting," Microelectronics Journal 39 (2008).

Ly et al., "Modeling and characterization of piezoelectric cantilever bending sensor for energy harvesting," Sensors and Actuators A 168 (2011).

Toprak et al., "Piezoelectric energy harvesting: State-of-the-art and challenges," Applied Physics Reviews 1, 031104 (2014).

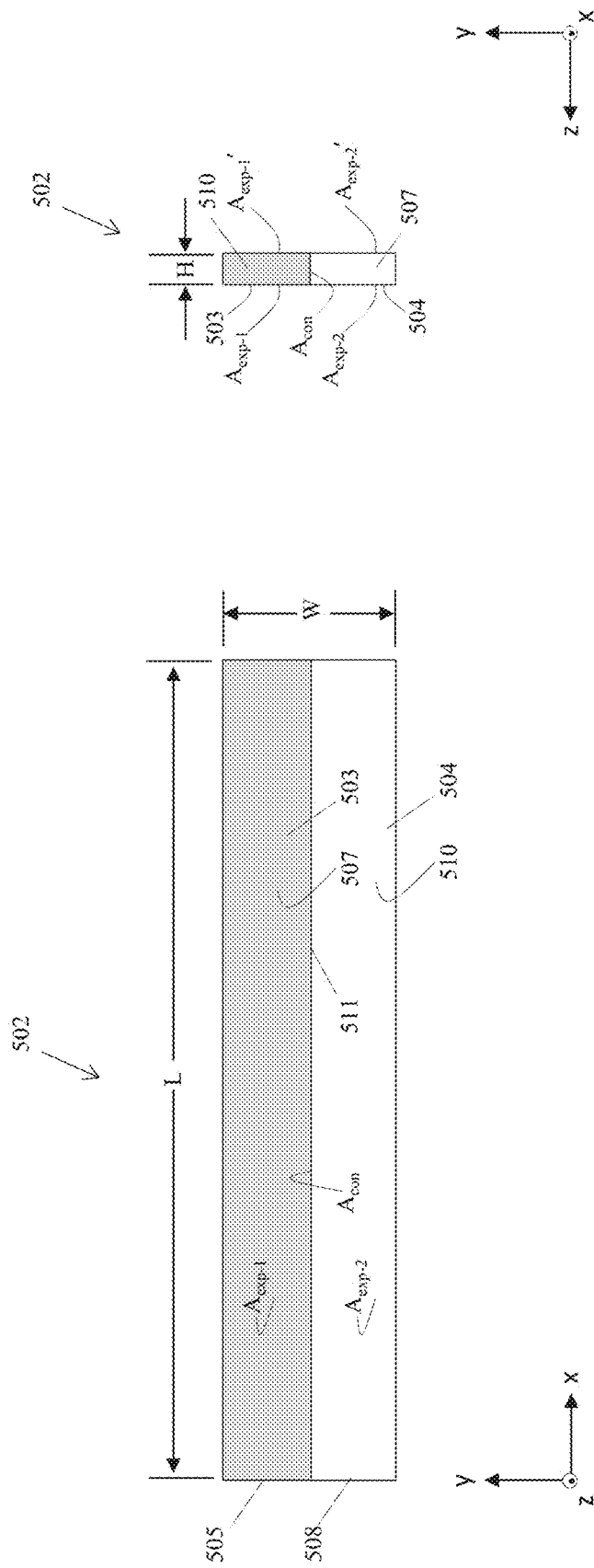

LIGHT ACTIVATED PIEZOELECTRIC CONVERTER

RELATION TO OTHER APPLICATIONS

This patent application claims priority from provisional patent application 62/311,704 filed Mar. 22, 2016 and non-provisional patent application Ser. No. 15/093,047 filed Apr. 7, 2016, which are hereby incorporated by reference in their entirety.

FIELD OF THE INVENTION

One or more embodiments relates to an energy harvesting light activated piezoelectric converter for the generation of electrical power using deflection of a cantilever vane having surfaces of differing emissivity and a piezoelectric material coupled thereto. The higher and lower emissivity surfaces are generally co-planer with each other and co-planer with the deflection of the vane and the subsequent stress on the piezoelectric material.

BACKGROUND

As is understood, a force or stress applied to a piezoelectric material leads to an electric charge being induced across the material, and conversely, the application of a charge or electric field to the same material results in a change in strain or mechanical deformation. A particular configuration utilizing this property for various uses such as sensing, actuation, and energy harvesting is the piezoelectric cantilever. As a sensor, typically the piezoelectric cantilever features a piezoelectric material integrally attached to a cantilever in a manner such that deflection of the cantilever by some stimulus generates or alters deflection of the cantilever, subsequently generating or altering stress on the piezoelectric material, and generating or altering a voltage produced as a result of the stress. See e.g. U.S. Pat. No. 7,104,134 to Amano et al., filed Mar. 5, 2004 and issued Sep. 12, 2009; see also U.S. Pat. No. 6,453,748 to Pryor, filed Dec. 15, 1999 and issued Sep. 24, 2002, among others. As actuators, the tendency of piezoelectric materials to deform under the influence of an applied voltage is typically exploited to affect movement or manipulation. See e.g., U.S. Pat. No. 5,780,727 to Gimzewski et al., filed Sep. 12, 1994 and issued Jul. 14, 1998, among others. As energy harvesting devices, typically the cantilever is driven to oscillate as a result of external ambient influences, and resulting energy arising from deformation of the piezoelectric is collected through electrodes typically arranged in a $d_{31}$ or $d_{33}$ configuration. See e.g., U.S. Pat. No. 7,687,977 to Xu, filed Apr. 10, 2006 and issued Mar. 30, 2010; see also U.S. Pat. No. 7,521,841 to Clingman et al., filed Feb. 1, 2006 and issued Apr. 21, 2009; see also U.S. Pat. No. 7,777,396 to Rastegar et al., filed Jun. 6, 2006 and issued Aug. 17, 2010, among others. Generally approaches concentrate on either direct mechanical influences such as vibration of a connecting member or structure to generate cantilever deflection or provide cantilever oscillation, or concentrate on ambient heat to provide cantilever deformation based on contrasting thermal characteristics within the cantilever. Generally forces arising from thermal creep on a cantilever have not been exploited to provoke cantilever deflection.

Thermal transpiration or thermal creep refers to the thermal force on a gas due to a temperature difference. A well-known device which relies on thermal transpiration is Crookes' Radiometer, also known as a light mill. Generally the light mill is a small chamber containing typically four or more vanes mounted symmetrically around a vertically-oriented axle, with opposing sides of each vane generally parallel to the axle. Light impinging on the chamber generates a force of the vane from hotter to opposing colder sides as air molecules in the vessel strike on the vanes. See e.g., Scandurra et al., "Gas kinetic forces on thin plates in the presence of thermal gradients," *Physical Review E* 75(2) (2007), among others. A variety of devices have exploited the resulting rotation of vertical-surface driven light mills. See, for example, U.S. Pat. No. 4,410,805 issued to Berley, issued Oct. 18, 1983, and see U.S. Pat. No. 4,397,150 issued to Paller, issued Aug. 9, 1983, and see U.S. patent application Ser. No. 14/288,253, filed by Nutter et al. on May 27, 2014 and published as US 2015/0013337 A1 on Jan. 15, 2015, and see U.S. Pat. No. 4,926,037 issued to Martin-Lopez, issued May 15, 1990, and see U.S. Pat. No. 9,106,112 B2 issued to Farquharson et al., issued Aug. 11, 2015. Thermal transpiration has also been employed to address challenges inherent to miniaturized moving parts, such as micropumps. See e.g. U.S. Pat. No. 5,871,336 issued to Young, issued Feb. 16, 1999, and see U.S. Pat. No. 8,235,675 issued to Gianchandani et al., issued Aug. 7, 2012, and see U.S. Pat. No. 5,611,208 issued to Hemmerich et al., issued Mar. 18, 1997, among others. In these applications, asymmetric momentum transfer between gas molecules and channel walls results in an effective momentum transfer to the channel walls in the direction opposite to a temperature gradient, generating a force parallel to the channel surface.

Disclosed here is a piezoelectric cantilever which generates thermal creep and corresponding momentum transfers in order to generate cantilever deflection and stress on a coupled piezoelectric material in response to a radiant flux such as light. The cantilever comprises a vane having planar surfaces of differing emissivities, with a piezoelectric material coupled to a section of the vane. When a radiant flux such as light simultaneously impinges the adjacent high emissivity and low emissivity surfaces, the differing emissivities generate a thermal creep force and deflection of the vane, with subsequent stress on the coupled piezoelectric material. Electrical power is harvested via electrodes in electrical contact with the piezoelectric material.

These and other objects, aspects, and advantages of the present disclosure will become better understood with reference to the accompanying description and claims.

SUMMARY

The disclosure provides a light activated piezoelectric converter comprising a vane having a proximate end affixed to a foundation and extending to an unencumbered distal end. The vane comprises a planar surface divided into a first surface of higher emissivity and a second surface of lower emissivity. The light activated piezoelectric converter additionally comprises a piezoelectric material coupled to a section of the vane, and first and second electrodes electrically contact the piezoelectric material for energy harvesting when the piezoelectric material is placed under a stress. When a radiant flux such as light simultaneously impinges the adjacent high emissivity and low emissivity surfaces, the differing emissivities produce a temperature gradient across the vane and generally parallel to the vane surfaces. This generates a thermal creep force across the planar surface of the vane in a direction from the high emissivity surface to the low emissivity surface, and generates a deflection of the vane by virtue of the affixed proximate end and free distal end. The deflection of the vane generates a stress on the coupled piezoelectric material, and electrical power is harvested via the first and second electrodes in electrical contact with the piezoelectric material.

A method for generating a voltage using a radiant flux is additionally disclosed comprising surrounding a cantilevered vane with a gaseous atmosphere, where the vane comprises a first surface and a second surface of differing emissivities, and directing a radiant flux toward the vane. The radiant flux generates a first temperature on the first surface and a second temperature on the second surface, resulting in a temperature gradient across the vane and thermal creep force from the first surface to the second surface. The thermal creep force generates a deflection of the vane and a stress on a coupled piezoelectric material, and voltage is harvested between a first and second electrode in electrical contact with the piezoelectric material.

The novel apparatus and principles of operation are further discussed in the following description.

BRIEF DESCRIPTION OF THE DRAWINGS

FIG. 5A illustrates a first view of particular vane utilized by the light activated piezoelectric converter.

FIG. 5B illustrates a second view of the particular vane utilized by the light activated piezoelectric converter.

Embodiments in accordance with the invention are further described herein with reference to the drawings.

DETAILED DESCRIPTION OF THE INVENTION

The following description is provided to enable any person skilled in the art to use the invention and sets forth the best mode contemplated by the inventor for carrying out the invention. Various modifications, however, will remain readily apparent to those skilled in the art, since the principles of the present invention are defined herein specifically to provide a light activated generator for the production of a voltage using a cantilever activated by an incident radiant flux.

The disclosure provides a light activated piezoelectric converter comprising a vane having a proximate end affixed to a foundation and extending to an unencumbered distal end. The vane comprises a planar surface divided into a first surface of higher emissivity and a second surface of lower emissivity. The light activated piezoelectric converter additionally comprises a piezoelectric material coupled to a section of the vane, and first and second electrodes electrically contact the piezoelectric material for energy harvesting when the piezoelectric material is placed under a stress. When a radiant flux such as light simultaneously impinges the adjacent high emissivity and low emissivity surfaces, the differing emissivities produce a temperature gradient across the vane and generally parallel to the vane surfaces. This generates a thermal creep force across the planar surface of the vane in a direction from the high emissivity surface to the low emissivity surface, and generates a deflection of the vane by virtue of the affixed proximate end and free distal end. The deflection of the vane generates a stress on the coupled piezoelectric material, and electrical power is harvested via the first and second electrodes in electrical contact with the piezoelectric material. The piezoelectric material is generally coupled to either a first section of the vane or second section of the vane, and coupled to vane such that a deflection of the vane in for example an x-y plane generates a stress on the piezoelectric material in the x-y plane. In certain embodiments, a width W of the vane is at least 5 times greater than a height H of the vane, and a length L is at least 5 times greater than the height H. In other embodiments, the width W is less than about 100 µm and the light activated rotor is surrounded by air at a pressure of at least 80 kPa. In certain embodiments, the light activated piezoelectric converter further comprises an energy harvesting circuit, and in other embodiments, the light activated piezoelectric converter further comprises one or more additional vanes similarly experiencing thermal creep and arranged to rotate for the purpose of periodically interrupting impingement of the radiant flux on the primary vane of the light activated piezoelectric converter.

Figure 1:
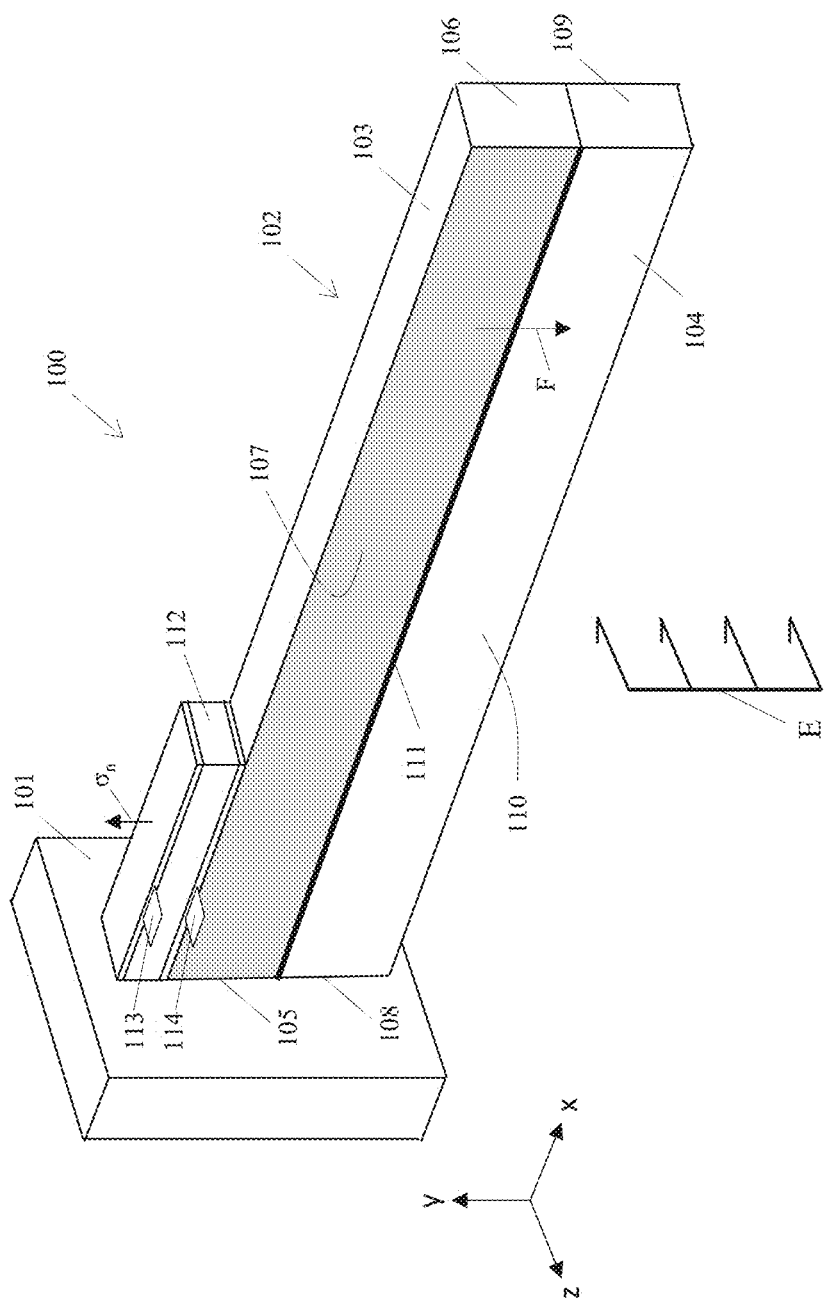
FIG. 1 illustrates an embodiment of a light activated piezoelectric converter.

FIG. 1 illustrates an embodiment of a light activated piezoelectric converter generally indicated at 100. Light activated piezoelectric converter 100 comprises a foundation 101 and a vane generally indicated at 102 coupled to foundation 101. Vane 102 comprises a first section 103 and a second section 104, with first section 103 comprising a proximate end 105 and a distal end 106 and second section 104 comprising a proximate end 108 and distal end 109. The proximate end 105 of first section 103 and the proximate end 108 of second section 104 are coupled to foundation 101. In a particular embodiment, proximate end 105 of first section 103 and the proximate end 108 of second section 104 are fixably attached to foundation 101.

First section 103 further comprises first surface 107, and second section 104 further comprises second surface 110. Further, first surface 107 and second surface 110 border a common boundary 111 and are typically adjacent. Additionally, some portion of first surface 107 and second surface 110 are coplaner over some length of common boundary 111. For example, at FIG. 1, common boundary 111 is generally parallel to the x-axis shown and first surface 107 and second surface 110 comprise a plane parallel to the x-y plane over substantially the entirety of common boundary 111. In a particular embodiment, at least 50%, 75%, or 90% of common boundary 111 is parallel to an x-axis, and at least 50%, 75%, or 90% of first surface 107 and at least 50%, 75%, or 90% of second surface 110 is substantially parallel to a x-y plane comprising the x-axis.

Additionally, at FIG. 1, first surfaces 107 and second surface 110 are surfaces of differing emissivity, with first surface 107 having a greater emissivity than second surface 110. As a result, if surfaces 107 and 110 are in thermal equilibrium with each other and a surrounding environment, and are then exposed to a radiant flux such as light E, the apparent temperature of the environment increases and first surface 107 and second surface 110 increase in temperature until they are again at equilibrium with the environment and each other, but the first surface 107, with greater emissivity, will initially increase in temperature more quickly. As a function of time then, the temperature difference between first surface 107 and second surface 110 will be substantially zero before being exposed to light E and increase to a maximum as first surface 107 heats up more quickly. Here, "radiant flux" means electromagnetic radiation emitted, reflected, transmitted or received, per unit time. The temperature difference when exposed to a radiant flux such as light E provokes thermal creep force such as F acting from first surface 107 to second surface 110. See Wolfe et al., "A Horizontal Vane Radiometer: Experiment, Theory, and Simulation," *Phys. Fluids* 28, (2016); see also U.S. patent application Ser. No. 15/093,047 filed by Larraza et al., filed Apr. 7, 2016. The thermal creep force affects a deflection of vane 102 generally in the x-y plane illustrated because of its attachment to foundation 101 at proximate ends 105 and 108 and free distal ends 106 and 109.

Light activated piezoelectric converter 100 further comprises piezoelectric material 112 coupled to first section 103 or second section 104. First electrode 113 and second electrode 114 are in electrical contact with piezoelectric material 112. As is understood, piezoelectric materials such as 112 can convert a mechanical strain inflicted on the material into electrical charge. At FIG. 1, piezoelectric material 112 is coupled to vane 102 in a manner such that a deflection of vane 102 generates a mechanical strain on piezoelectric material 112. For example, in an embodiment, piezoelectric material 112 is fixably attached to first section 103 or second section 104. As a result, deflection of vane 102 generated by the incidence of radiant flux E generates a stress such as $\sigma_n$ at FIG. 1, and generates a voltage between first electrode 113 and second electrode 114. Here, "electrical contact" means that a first component and a second component establish a physical proximity such that an electrical current may flow between the first component and the second component, where the current may flow directly between the first component and the second component, or may additionally flow through intervening components in a current path between the first component and the second component.

Piezoelectric material 112 may comprise any appropriate material such as lead zirconate titanate (PZT), lead magnesium niobate-lead zirconate titanate (PMN-PZT), lead zirconate niobate-lead zirconate titanate (PZN-PZT), aluminum nitride (AlN), zinc oxide (ZnO), piezoceramic-polymer fiber composites, or the like, for example. See e.g., *Piezoelectric and Acoustic Materials for Transducer Applications* (A. Safari and E. Akdogan ed., 2008), among others. The thickness of the piezoelectric material 112 depends on the piezoelectric material and the specific requirement of a particular application. Further, first electrode 113 and second electrode 114 may be in electrical contact with piezoelectric material 112 in a $d_{31}$ configuration, a $d_{33}$ configuration, or other configurations known in the art for piezoelectric materials. See e.g. Kim et al., "Comparison of MEMS PZT Cantilevers Based on $d_{31}$ and $d_{33}$ Modes for Vibration Energy Harvesting," *Journal of Microelectromechaical Systems*, 22 (1) (2013), among others. Additionally, the light activated piezoelectric converter may comprise electrically insulating materials such as $Al_2O_3$ or others which may be placed and utilized to provide electrical insulation between components as required.

In a particular embodiment, a reference plane such as the x-y plane of FIG. 1 is parallel with second surface 110 and first surface 107 over a portion of the common boundary 111, and vane 102 is configured to place a stress on piezoelectric material 112 parallel to the reference plane when the distal end 106 of first section 103 and/or the distal end 109 of second section 110 deflects in a direction parallel to the reference plane. Piezoelectric material 112 may be coupled to vane 102 in any manner provided that the deflection of vane 102 generates the stress. Here and elsewhere, when a first and second object are "coupled," this means that the first and second object are in direct physical contact or that the first object is in direct physical contact with an intervening object or group of objects which is direct physical contact with the second object, where the direct physical contact may be permanent or impermanent, continuous or intermittent, and where the first and second objects may act as a single rigid body when coupled or may retain some capacity for independent movement when coupled.

Generally, first surface 107 has a first emissivity $\varepsilon_H$ and second surface 110 has a second emissivity $\varepsilon_C$, and $(\varepsilon_H-\varepsilon_C)$ ≥0.1. Further, common boundary 111 allows close enough proximity between first surface 107 and second surface 110 to create a continuous temperature gradient in a surrounding gas. In an embodiment, the proximity is no greater than 10 mean free paths of a surrounding atmosphere between the two surfaces, in another embodiment no greater than 5 mean free paths, and in still another embodiment no greater than 1 mean free path. The common boundary may be a common border between the first and second surfaces, may comprise an intervening material between the first and second surfaces, or may comprise a physical gap between the first and second surfaces. In another embodiment, first surface 107 has a first width parallel to a y-axis, second surface 110 has a second width parallel to the y-axis, and common boundary 111 has a boundary width parallel to the y-axis, where the boundary width may be zero, and a total width equal to the first width added to the second width added to the boundary width is greater than 3 mean free paths of an atmosphere surrounding the vane, in another embodiment greater then 5 mean free paths, in another embodiment greater than 10 mean free paths, and in another embodiment greater than 20 mean free paths.

Figure 2:
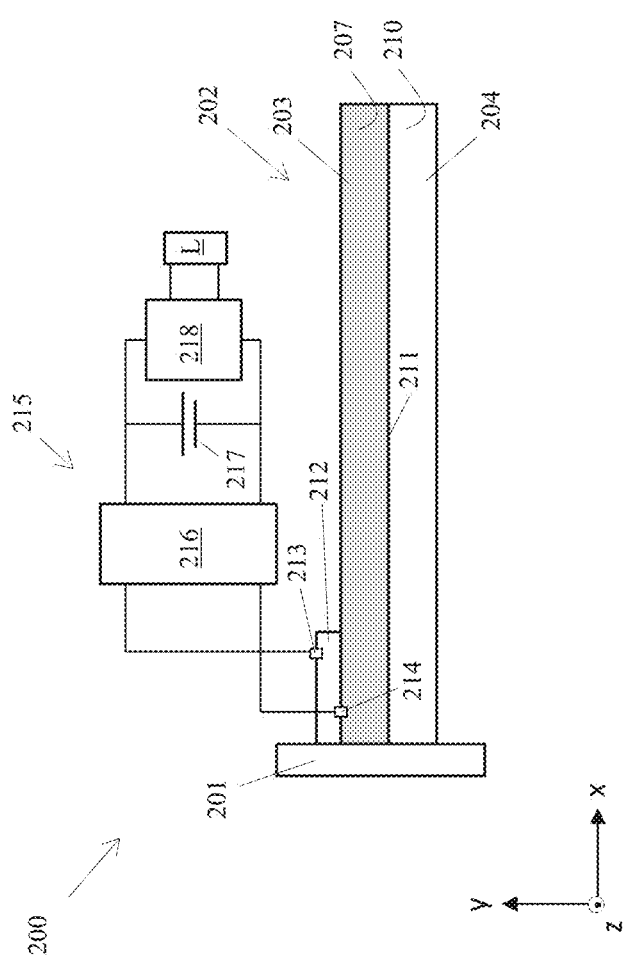
FIG. 2 illustrates another embodiment of a light activated piezoelectric converter.

In a particular embodiment, the light activated piezoelectric converter further comprises an energy harvesting circuit in electrical contact with the first and second electrode. As an example, FIG. 2 illustrates a light activated piezoelectric converter generally indicated as 200 comprising a vane 202 fixably attached to a foundation 201. Vane 202 comprises first section 203 with first surface 207 and second section 204 with second surface 210, with first surface 207 and second surface 210 separated by common boundary 211. Piezoelectric material 212 is fixably attached to first section 203 with first electrode 213 and second electrode 214 in electrical contact with piezoelectric material 212. Additionally, an energy harvesting circuit generally indicated by 215 is in electrical contact with first electrode 213 and second electrode 214. Energy harvesting system 215 receives voltage generated by piezoelectric material 212 during flexure of vane 202 via electrodes 213 and 214 and conditions and/or stores the voltage for use by load L. In an embodiment, energy harvesting circuit 215 comprises AC/DC rectifier 216, storage capacitor 217, and voltage regulator 218 such as a DC/DC converter providing output when the stored energy of storage capacitor 217 is sufficient. Energy harvesting circuit 215 may be any combination of components analog or digital which act to provide micro-harvesting by storing a voltage output from the first and second electrodes and providing some manner of conditioning prior to supplying a power derived from that voltage output to a load. See e.g., *Energy Harvesting Technologies* (S. Priya and D. Inman ed., 2008); see also Ferrari et al, "Piezoelectric multifrequency energy converter for power harvesting in autonomous microsystems," *Sensors and Actuators A* 142 (2008); see also Guan et al., "Characteristics of Energy Storage Devices in Piezoelectric Energy Harvesting Systems," *Journal of Intelligent Material Systems and Structures* 19 (2008); see also Ottman et al, "Adaptive Piezoelectric Energy Harvesting Circuit for Wireless Remote Power Supply," *IEEE Transactions on Power Electronics* 17(5) (2002); see also Ottman et al., "Optimized Piezoelectric Energy Harvesting Circuit Using Step-Down Converter in Discontinuous Conduction Mode," *IEEE Transactions on Power Electronics* 18(2) (2003), among others.

In a particular embodiment, the light activated piezoelectric converter additionally comprises an atmosphere surrounding the vane and a radiant flux impinging the first surface and the second surface, where the radiant flux generates a first temperature on the first surface and a second temperature on the second surface with the first temperature greater than the second temperature. In this embodiment, the first and second temperatures provide a temperature gradient and generate a thermal creep force from the first surface to the second surface and the thermal creep force generates a deflection of the vane. The deflection of the vane generates a stress on the piezoelectric material and the piezoelectric material generates a voltage between the first electrode and the second electrode. In certain embodiments, the atmosphere surrounding the vane comprises air at a pressure of at least 80 kPa. In other embodiments, the vane has a total width across the first section, second section, and common boundary of less than 100 microns. In another embodiment, the first surface and the second surface are separated by the portion of the common boundary by a distance less than or equal to 10 mean free paths of the atmosphere.

Typically the total width W of vane 102 (where width is along the z-axis of FIG. 1) exceeds the height H of vane 102 (where height is along the y-axis of FIG. 1), and correspondingly the thermal creep forces provoked by light activated piezoelectric converter 100 are generated largely within the x-y plane of FIG. 1. In a particular embodiment, the width W of vane 102 is at least 5 times greater than the height H of vane 102. In another embodiment, the width W is at least 10 times greater. In typical embodiments, the height H is less than the width W. Light activated piezoelectric converter 100 thereby exploits the temperature gradient which arises across the adjacent first surface 107 and second surface 110 through differing emissivity when illuminated by light E in order to provide a thermal creep force and vane deflection generally parallel to the adjacent surfaces. The adjacent arrangement of first surface 107 and second surface 110 largely removes the strict requirement limiting generated thermal creep to surrounding pressures in which mean free path lengths are large with respect to the geometrical dimensions of an apparatus. See Wolfe et al., *Phys. Fluids* 28, and see U.S. patent application Ser. No. 15/093,047 by Larraza et al. In a particular embodiment where the light activated rotor is surrounded by an atmosphere, the total width W of vane 102 is greater than three times the mean free path of the atmosphere. Mean free paths of a surrounding atmosphere may be determined using methods known in the art. See P. P. J. M. Schram, *Kinetic Theory of Gases and Plasmas* (1991), among others. In another embodiment, a length L of vane 102 extends from proximate end 105 to distal end 106 and parallel to the x-y plane of FIG. 1, and the length L is less than 100 microns, the width W is greater than the height H, and the length L is at least 5 times greater than the height H.

Figure 3:
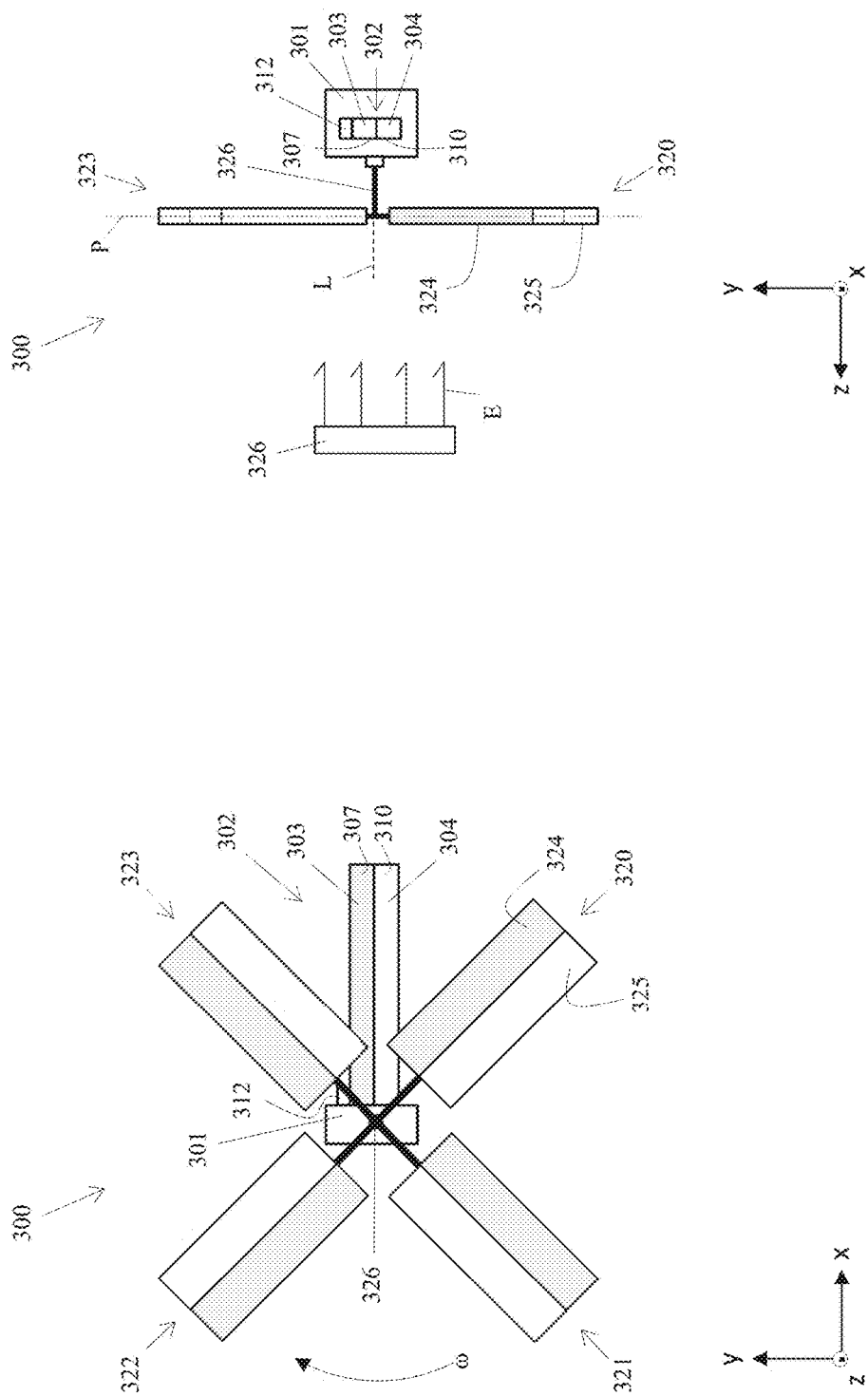
FIG. 3A illustrates a first view of an additional embodiment of the light activated piezoelectric converter.
FIG. 3B illustrates a second view of the additional embodiment of the light activated piezoelectric converter.

In a particular embodiment the light activated piezoelectric converter further comprises an axle coupled to the foundation and having a longitudinal axis, and at least one second vane in mechanical contact with the axle and configured to revolve around the longitudinal axis of the axle. For example, FIGS. 3A and 3B illustrate light activated piezoelectric converter 300 comprising foundation 301, piezoelectric material 312, and vane 302 with first section 303 and second section 304 comprising first surface 307 and second surface 310 respectively. Light activated piezoelectric converter further comprises an axle 326 extending from foundation 301 with longitudinal axis L, and additional vanes 320, 321, 322, and 323 in mechanical contact with axle 326. Each of vanes 320, 321, 322, and 323 comprises a first surface and a second surface, such as first surface 324 and second surface 325 of vane 320. Vanes 320, 321, 322, and 323 are configured to revolve as a group around the longitudinal axis L of axle 326 in a rotation such as w. Vanes 320, 321, 322, and 323 may be in mechanical contact with axle 326 via a hub which also rotates around longitudinal axis L, or fixably attached to axle 326 when axle 326 is intended to itself rotate, or any arrangement whereby vanes 320, 321, 322, and 323 may revolve around the longitudinal axis L. In operation, vanes 320, 321, 322, and 323 as well as vane 302 are oriented to receive a radiant flux such as E, and vanes 320, 321, 322, and 323 as well as vane 302 generate thermal creep forces from a first surface to a second surface as a result of the radiant flux E through physical mechanisms as previously described. Thermal creep force on vane 302 generates a voltage as previously described, while the thermal creep forces on vanes 320, 321, 322, and 323 generates rotation of the group around longitudinal axis L in, for example, plane of rotation P. Plane of rotation P is between vane 302 and the radiant flux source 326, so that rotation of vanes 320, 321, 322, and 323 acts to periodically disrupt impingement of the radiant flux E on vane 302. As a result, the thermal creep force on vane 302 cycles and vane 302 goes through periodic deflection and relaxation cycles, increasing the power harvested from piezoelectric material 312.

Figure 4:
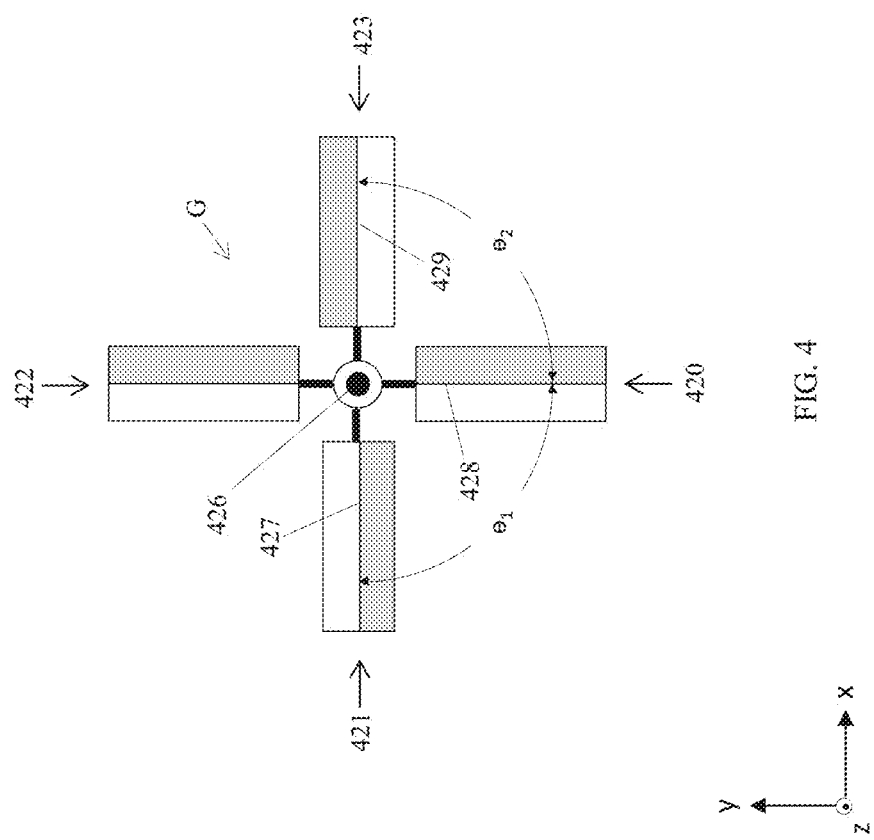
FIG. 4 illustrates a plurality of additional vanes utilized by some embodiments of the light activated piezoelectric converter.

FIG. 4 illustrates a plurality of vanes 420, 421, 422, and 423 configured to revolve as a group around the longitudinal axis of an axle 426. At FIG. 4, each vane in the plurality of vanes is separated from every other vane by a gap G, such that a first surface of a first vane and a second surface of a second vane are not in contact over a distance of at least 75%, 85%, or 95% of the common boundary of either vane. In another embodiment, the plurality of vanes is arranged symmetrically, such that the common boundary of a given vane is separated from the common boundary of an adjacent vane by an angle θ, and each angle θ in the plurality is within 20 degrees of every other angle θ in the plurality. For example, at FIG. 4, where angle $\theta_1$ extends between common boundary 427 of vane 421 and common boundary 428 of vane 429, and angle $\theta_2$ extends between common boundary 428 of vane 421 and common boundary 429 of vane 423, angle $\theta_1$ is within twenty degrees of angle $\theta_2$. See U.S. patent application Ser. No. 15/093,047 by Larraza et al.

Within this disclosure, when a first and second line is "parallel" or "substantially parallel," this means that a first direction vector is parallel to the first line and a second direction vector is parallel to the second line, and the angle between the first direction vector and the second direction vector is less than 15 degrees, preferably less than 10 degrees, more preferably less than 5 degrees, and more preferably less than 1 degree. Similarly, when a first line is "perpendicular" or "substantially perpendicular" to a second line or a geometric plane, this means that a first direction vector is parallel to the first line and a second direction vector is parallel to the second line or parallel to a line within the geometric plane, and the angle between the first direction vector and the second direction vector is at least 75 degrees, preferably at least 80 degrees, more preferably at least 85 degrees, and more preferably at least 1 degree. Similarly, when a first surface or plane and a second surface or plane are "co-planer" or "substantially co-planer" over some displacement X such as a portion of the common boundary, this means that over the distance X, the first line and the second line are in-plane with the reference plane to within 0.3 X, more preferably to within 0.15 X and more preferably with 0.05 X. Further, when a surface is "parallel" or "substantially parallel" to a reference plane, this means a reference line intersects both the surface and the reference plane, and the reference line is substantially perpendicular to the surface and the reference plane.

Additionally, as discussed, common boundary 111 provides sufficient proximity between the first surface 107 and second surface 110 to create a continuous temperature gradient in a surrounding gas. In a particular embodiment, common boundary 111 has a width dimension $W_B$ parallel to the width W of vane 102, and $W_B$ is less than or equal to 10 mean free paths of a surrounding atmosphere. In another embodiment, width dimension $W_B$ of common boundary 111 is less than or equal to 5 mean free paths, and in another embodiment, less than or equal to 1 mean free path. The common boundary may be a common border between the first and second surfaces, may comprise an intervening material between the first and second surfaces, or may comprise a physical gap between the first and second surfaces such as an air gap. In the configurations provided in this disclosure, the thermal creep force is a function of the thermal creep shear pressure and the area over which that pressure acts, and the thermal creep shear pressure is a function of the temperature difference between the two surfaces. Correspondingly, in some embodiments common boundary 111 comprises an insulating material to mitigate temperature equalization between the first and second sections while still providing for thermal creep force from the first surface to the second surface. When common boundary 111 comprises some insulating material, it may be advantageous to provide a $W_B$ of about 10 mean free paths to allow thermal creep forces to act on the insulator surface while also providing for increased insulation by the insulator. With a solid insulator, increasing the width typically increases the temperature difference and therefore the thermal creep shear pressure without decreasing the area over which the pressure can act. In contrast, with an air gap, increasing the gap decreases the area over which the thermal creep shear pressure can act. In such cases, it may be advantageous to provide a $W_B$ of about 1 mean free path. In a particular embodiment where the light activated generator is surrounded by an atmosphere having a mean free path $\lambda$ and a vane has the width W, and $W \leq 100\lambda$ and $W_B \leq 10\lambda$. In another embodiment, $W_B \leq W/5$, in another embodiment $W_B \leq W/10$, in another embodiment $W_B \leq W/50$, and in another embodiment $W_B \leq W/100$.

The light activated piezoelectric converter disclosed may be constructed at any scale which allows thermal creep forces to generate deflection of a vane and generation of voltage as described. In a particular environment, the light activated piezoelectric converter is a microelectromechanical system (MEMS) device. In some embodiments, the light activated piezoelectric converter has characteristic dimensions such as length, width, and height less than about 100 µm. The light activated piezoelectric converter as described may be fabricated using any combination of means known in the art, including techniques generally known as bulk micromachining, surface micromachining, molding, casting, lithography, etching, chemical vapor deposition (CVD), physical vapor deposition (PVD), electrodeposition, and other applicable techniques. See e.g. N. P. Mahalik, *Microelectromechanical Systems* (2008), among others.

An embodiment of a particular vane is further illustrated as vane 502 at FIGS. 5A and 5B, with orientation in accordance with the axes shown. Vane 502 comprises first section 503 comprising first surface 507 and a second section 504 comprising second surface 510, where first surface 507 and second surface 510 have a common boundary 511. Vane 502 is coupled to a foundation (not shown) at proximate end 505 of first section 503 and proximate end 508 of second section 504. First surface 507 and second surface 510 border common boundary 511 and are coplanar over at least some portion of common boundary 511. Additionally at FIGS. 5A and 5B. vane 502 has dimensions comprising a width W, height H, and length L. For illustration, the length L is parallel to the x-axis, the width W is parallel to the y-axis, the height H is parallel to the z-axis. Further, first section 503 and second section 504 are generally in thermal conductive communication over an area $A_{con}$, where common boundary 511 comprises at least some portion of the area $A_{con}$. Here, "thermal conductive communication" means that first section 503 and second section 504 are in sufficient proximity such that conductive heat transfer may occur between first section 503 and second section 504 through the area $A_{con}$. In an embodiment, when first section 503 comprises a surface having a first temperature and second section 504 comprises a surface having a second temperature less than the first temperature, and first section 503 and second section 504 are in thermal conductive communication, conductive heat flow occurs from first section 503 to second section 504 through the area $A_{con}$ and through a portion of common boundary 511 comprising the area $A_{con}$. Additionally, an area $A_{exp-1}$ is equal to the surface area of first section 503 exposed to radiant flux and an area $A_{exp-2}$ is equal to the surface area of second section 504 exposed to radiant flux. Generally at FIG. 3, $A_{con}$ has dimensions of W by H and $A_{exp-1}$ and $A_{exp-2}$ have dimensions of L by W/2, and $A_{exp-1}$ and $A_{exp-2}$ have areas substantially equivalent to first surface 507 and second surface 510 respectively. In a particular embodiment, first surface 507 and second surface 510 have dimensions such that a ratio $R_{AREA}$ is equal to the area of first surface 507 divided by the area of second surface 510, and $0.5 \leq R_{AREA} \leq 1.5$, preferably $0.7 \leq R_{AREA} \leq 1.3$, and more preferably $0.9 \leq R_{AREA} \leq 1.1$. At FIG. 3B, if vane 502 is illuminated by a radiant flux additionally impinging the opposing sides of vane 502, $A_{exp-1}$ and $A_{exp-2}$ further comprise areas $A_{exp-1}'$ and $A_{exp-2}'$ respectively.

When activated by a radiant flux such as light, vane 502 generates a thermal creep force by virtue of a temperature gradient across first surface 503 and second surface 504, and based on an atmosphere surrounding the vane. When the mean free path is larger than the typical length of the temperature gradient, the tangential stress on a surface in the x-y plane due to a temperature gradient along the y-direction can be calculated to be:

$$p_{shear} = \frac{15 k_B \alpha}{64\sqrt{2}\, \sigma_{CS}} \frac{dT}{dy}, \tag{1}$$

with $k_B$ Boltzmann's constant, a the accommodation coefficient of the plate, $\sigma_{CS} = \pi d^2$ the hard-sphere collision cross section of molecules with diameter d, and dT/dy the temperature gradient. See Scandurra et al., (2007). If all collisions are assumed to be either perfectly specular or perfectly diffuse, the accommodation coefficient is the fraction of diffuse collisions in a sample. The value of the accommodation coefficient thus ranges between zero and one. The thermal creep force, $F_{TC}$, is this pressure multiplied by the area over which it acts. Taking into account slip length corrections, this force is:

$$F_{TC} = \frac{15}{64\sqrt{2}} \frac{k_B}{\sigma_{CS}} \Delta T \alpha L' \min\left(\frac{W_V}{W_{Ggas}}, 1\right), \tag{1}$$

where $W_V$ is the width of the vane, $$W_{Ggas} = W_{Gsurf} + 2\lambda \frac{2-\alpha}{\alpha}, \tag{2}$$

is the width of the temperature gradient in the gas, with $W_{Gsurf}$ the width of the temperature gradient on the surface of the vane, and $$L' = L - \frac{1}{2}\lambda \frac{2-\alpha}{\alpha}, \tag{3}$$

the correction to the vane's length L perpendicular to the temperature gradient.

The temperature difference ($\Delta T$) on vane 502 is a function of the thermal energy of first section 503 and second section 504. If $T_H$ is the temperature of a hot side for example first section 503, $T_C$ is the temperature of a cold side for example second section 504, C is a heat capacity substantially equivalent in both sections, $U_H$ is the thermal energy of the hot side, and $U_C$ is the thermal energy of the cold side, then $$\Delta T = T_H - T_C = \frac{1}{C}(U_H - U_C) \tag{5}$$

The temperature difference is a maximum when the time rates of change of the thermal energies of the two halves are equal.

$$\frac{\partial(\Delta T)}{\partial t} = 0 \rightarrow \frac{\partial U_H}{\partial t} = \frac{\partial U_C}{\partial t} \tag{6}$$

Generally for at least centimeter sizes dimensions of W, H, and L, the temperature difference on the vanes is not expected to vary with the pressure of a surrounding atmosphere, suggesting convective heat transfer between first section 503 and second section 504 is relatively negligible. The time rates of change of the thermal energies are thus functions of their respective net black body radiation and the thermal conduction rate between them, or $$\frac{\partial U_H}{\partial t} = \sigma_{SB}\varepsilon_H A_{exp}(T_{env}^4 - T_H^4) - k_t A_{con}\frac{\Delta T}{W_G}, \tag{7}$$

and $$\frac{\partial U_C}{\partial t} = \sigma_{SB}\varepsilon_C A_{exp}(T_{env}^4 - T_C^4) + k_t A_{con}\frac{\Delta T}{W_G}, \tag{8}$$

where $\sigma_{SB}$ is the Stephan-Boltzmann constant, $\varepsilon$ is the emissivity, $A_{exp}$ is the surface area $A_{exp-1}$ or $A_{exp-2}$ when first surface 503 and second surface 504 are substantially equivalent, $T_{env}$ is the apparent temperature of a surrounding environment, $k_t$ is a thermal conductivity between first section 503 and second section 504 through the area $A_{con}$, and $W_G$ is the width of a temperature gradient in the vane.

The temperature of the hot side of the vane can be rewritten as a function of the temperature of the cold side and the temperature difference.

$$T_H = T_C + \Delta T = T_C\left(1 + \frac{\Delta T}{T_C}\right). \tag{9}$$

Typically the temperature difference is much smaller than the temperature of the cold side of the vane allowing the approximation $$T_H^4 = T_C^4\left(1 + \frac{\Delta T}{T_C}\right)^4 \approx T_C^4 + 4T_C^3\Delta T \tag{10}$$

Substituting approximation (10) into equation (7) then setting equal to equation (8) and solving for the temperature difference provides an expression for the maximum temperature difference, $$\Delta T_{max} \approx \frac{\sigma_{SB}(\varepsilon_H - \varepsilon_C)A_{exp}(T_{env}^4 - T_C^4)}{4\sigma_{SB}\varepsilon_H A_{exp}T_C^3 + \frac{2k_t A_{con}}{W_G}} \tag{11}$$

The scaling behavior of this relation depends on which is the dominant term in the denominator. For the centimeter size vanes, the blackbody term is more than 10 times greater than the thermal conductivity term due to the relatively large area exposed and characteristic length of the temperature gradient, and relatively small thermal conductivity and contact area between the two halves. Thus, for centimeter-scale vanes with low thermal conductivity, $$\Delta T_{max} \approx \frac{(\varepsilon_H - \varepsilon_C)(T_{env}^4 - T_C^4)}{4\varepsilon_H T_C^3} \tag{12}$$

This expression also reflects that the magnitude of the temperature difference is not generally a function of the width of the vanes.

The blackbody term is a function of two linear dimensions ($A_{exp}$ or generally L times W) while the thermal conductivity term is a function of one linear dimension and an aspect ratio ($A_{con}/W_G$ or L times H divided by W). For micron-scale vanes then the thermal conductivity term is likely to dominate the denominator. The smaller dimensions will also result in the characteristic length of the temperature gradient being equal to the width of the vane. Assuming the top and bottom of the vane are both exposed to the light source, the maximum temperature difference on a MEMS vane becomes, $$\Delta T_{max} \approx \frac{\sigma_{SB}(\varepsilon_H - \varepsilon_C)W^2(T_{env}^4 - T_C^4)}{2k_t H}, \tag{13}$$

or $$\frac{\Delta T_{max}}{W} \propto \frac{W}{H}, \quad (14)$$

where W is the width of the vane and H is the height or thickness of the vane. The temperature gradient is thus a function of the aspect ratio of the width (which affects the net blackbody radiation) to the thickness (which affects the thermal conductivity). It is not a function of the length (which affects both). The temperature difference is simply the temperature gradient times the width of the vane.

Ignoring edge corrections for the purpose of developing a scaling relation, the thermal creep force is thus linearly proportional to the length and temperature difference of the vane, or $$F_{TC} \propto \Delta TL \quad (15)$$

Combining this result with relation (14) provides the following scaling relationship for the thermal creep force on a MEMS vane.

$$F_{TC} \propto \frac{W^2 L}{H} \quad (16)$$

In an investigation of a vane such as vane 502, 8 mm by 16 mm vanes generated a 9 K temperature difference. The temperature gradient had a characteristic length of 3.5 mm and thermal creep was observed at 30 Pa. Thus, the width of the vane at this pressure is 35 mean free paths and the length is 70 mean free paths. The width of the vane equals the characteristic length of the temperature gradient when the vane is 3.5 mm by 7 mm and the mean free path is 0.1 mm. Using these values in equation (2) provides a force of 173 nN. Scaling relationships (14) and (16) then predict a 6 mK temperature difference and a 0.08 pN force on a 2.4 µm by 4.8 µm device at atmospheric pressure. If instead a force of 1 pN was desired, relation (16) indicates the length could be increased to 60 µm or width increased to 8.5 µm. See Wolfe et al., *Physics of Fluids*, 28(3) (2016); see also U.S. patent application Ser. No. 15/093,047 by Larraza et al.

For the cantilever beam with a piezoelectric base as depicted in FIG. 1, the voltage produced in the piezoelectric film is as follows where $d_{31}$ is the appropriate piezoelectric coefficient, F is the total force assumed to be applied at the free end of the cantilever beam, L is the length of the cantilever beam, W is the width of the cantilever bean, t is the thickness of the piezoelectric film, e is the permittivity of the piezoelectric film, and I is the area moment of inertia of a cross section of the cantilever beam. See C. Liu, *Foundations of MEMS* (2006).

$$V = \frac{d_{31} FLWt}{2\varepsilon I} \quad (17)$$

Substituting $W^3 H/12$ for the area moment of inertia where H is the height or thickness of the cantilever beam and multiplying by 3/8 to account for the fact the thermal creep force will be uniformly distributed over the cantilever beam and not applied solely at the free end provides the following result.

$$V = \frac{9 d_{31} FLt}{4\varepsilon W^2 H} \quad (18)$$

Combining equations (16) and (18) provides the following as the dependence of the voltage on the dimensions of the cantilever beam.

$$V \propto \frac{L^2}{H^2} \quad (19)$$

The voltage is thus a function of the ratio of the length to the thickness of the cantilever beam rather than the overall size and completely independent of the width of the cantilever beam. The devices can therefore be as small as MEMS manufacturing technology will allow and connected in series to create a higher overall voltage. According to equation (18), a 100 µm by 10 µm by 1 µm cantilever beam able to produce 1 pN of thermal creep force with a 1 µm thick zinc oxide film at is base would produce 150 nV. 1,000 such devices connected on a single chip would produce 150 µV. A periodic interrupter of the light source would maintain a continuous alternating current.

In a particular embodiment, $\epsilon_H$ is an emissivity of first surface 507 and $\epsilon_C$ is an emissivity of second surface 510, and the width W of FIG. 5 is a dimension describing the portion of first surface 507 and second surface 510 adjacent to and perpendicular to common boundary 511, and an area $A_{exp}$ is equal to the larger of $A_{exp-1}$ of first surface 507 or $A_{exp-2}$ of second surface 510, and first section 503 and second section 504 are in thermal conductive communication through the area $A_{con}$ as before. Further, a length L is equal to $A_{exp}$ divided by W and a height H is equal to $A_{con}$ divided by W, and $k_t$ is as previously defined. In some embodiments, vane 502 has dimensions of L, H, and W and the property $k_t$ such that when vane 502 is surrounded by an atmosphere at the temperature $T_{env}$, such as 294 K and $k_t \leq 2$ W/mK, a $\Delta T_1$ is defined by eqn (12) and a $\Delta T_2$ is defined by eqn (13), and $\Delta T_1/\Delta T_2 \leq 1$. In another embodiment, $\Delta T_1/\Delta T_2 \leq 0.1$, and in a further embodiment $\Delta T_1/\Delta T_2 \leq 0.01$. It is understood that the property $k_t$ is impacted by material selections for first section 503, second section 504, and common boundary 511 when common boundary 511 comprises an intervening material or gap, and may additionally be impacted by a thermal contact resistances, which may be determined using means known in the art. See e.g. C. V. Madhusudana, *Thermal Contact Conductance* (1995), among others.

In a particular embodiment, a total width of first surface 503 and second surface 504 is less than 100 µm. In another embodiment, the emissivity $\epsilon_H$ of first surface 503 is greater than or equal to 0.8 and the second emissivity $\epsilon_C$ of second surface 504 is less than 0.8. In other embodiments, the second emissivity $\epsilon_C$ of second surface 504 is less than 0.6. First section 503 and second section 504 may be comprised of any materials which meet the specifications disclosed herein. Additionally, first section 503 and second section 504 may comprise individual unitary pieces supporting or comprising first surface 503 and second surface 504 respectively, or may be portions of a single substrate supporting or comprising first surface 503 and second surface 504, or may be individual substrates each supporting either first surface 503 or second surface 504, or any other configuration generating a vane comprising a first surface and second surface as disclosed.

The disclosure additionally provides a method for generating a voltage using a radiant flux comprising: (i) surrounding a vane with a gaseous atmosphere, where the vane has a proximate end and a distal end where the proximate end is coupled to a foundation, and where the vane comprises a first surface and a second surface, where the first surface has a first emissivity and the second surface has a second emissivity where the second emissivity is less than the first emissivity, and where the second surface and the first surface have a common boundary where the second surface borders the first surface over a portion of the common boundary, and where the second surface is co-planer with the first surface over the portion of the common boundary; (ii) directing a radiant flux toward the first surface and the second surface of the vane; (iii) generating a first temperature on the first surface and a second temperature on the second surface using the radiant flux, where the first temperature is greater than the second temperature, thereby generating a temperature gradient across the vane; (iv) generating a thermal creep force from the first surface to the second surface using the temperature gradient and the gaseous atmosphere surrounding the vane: (v) generating a deflection of the vane using the thermal creep force; (vi) utilizing the deflection of the vane to generate a stress on piezoelectric material coupled to the vane; and (vii) harvesting a voltage from a first electrode in electrical contact with the piezoelectric material and a second electrode in electrical contact with the piezoelectric material, thereby generating the voltage using the radiant flux.

Thus, provided here is a light activated piezoelectric converter comprising a vane having a proximate end affixed to a foundation and extending to an unencumbered distal end. The vane comprises a planar surface divided into a first surface of higher emissivity and a second surface of lower emissivity, and a piezoelectric material coupled to a section of the vane. When a radiant flux simultaneously impinges the adjacent high emissivity and low emissivity surfaces, the differing emissivities produce a temperature gradient and thermal creep across the vane and generally parallel to the vane surfaces, generating a deflection of the vane by virtue of the affixed proximate end and free distal end. The deflection of the vane generates a stress on the coupled piezoelectric material, and electrical power is harvested via first and second electrodes in electrical contact with the piezoelectric material. The piezoelectric material is generally coupled to the vane such that a deflection of the vane in for example an x-y plane generates a stress on the piezoelectric material in the x-y plane. In certain embodiments, a width W of the vane is at least 5 times greater than a height H of the vane, and a length L is at least 5 times greater than the height H. In other embodiments, the width W is less than about 100 µm and the light activated rotor is surrounded by air at a pressure of at least 80 kPa.

It is to be understood that the above-described arrangements are only illustrative of the application of the principles of the present invention and it is not intended to be exhaustive or limit the invention to the precise form disclosed. Numerous modifications and alternative arrangements may be devised by those skilled in the art in light of the above teachings without departing from the spirit and scope of the present invention. It is intended that the scope of the invention be defined by the claims appended hereto.

In addition, the previously described versions of the present invention have many advantages, including but not limited to those described above. However, the invention does not require that all advantages and aspects be incorporated into every embodiment of the present invention.

All publications and patent documents cited in this application are incorporated by reference in their entirety for all purposes to the same extent as if each individual publication or patent document were so individually denoted.

What is claimed is:

1. A light activated piezoelectric converter comprising:
   a foundation;
   a vane comprising:
      a first section comprising a first surface between a proximate end of the first section and a distal end of the first section, where the proximate end of the first section is coupled to the foundation, and where the first surface has a first emissivity; and
      a second section comprising a second surface between a proximate end of the second section and a distal end of the second section, where the proximate end of the second section is coupled to the foundation, and where the second surface has a second emissivity, where the first emissivity minus the second emissivity is equal to at least 0.1, and where the second surface borders the first surface over a common boundary and the second surface is co-planer with the first surface over a portion of the common boundary;
   a piezoelectric material coupled to a single section of the vane, where the single section is either the first section of the vane or the second section of the vane;
   a first electrode in electrical contact with the piezoelectric material; and
   a second electrode in electrical contact with the piezoelectric material.

2. The light activated piezoelectric converter of claim 1 where a reference plane is parallel with the second surface and the first surface over the portion of the common boundary and where the vane is configured to place a stress on the piezoelectric material parallel to the reference plane when the distal end of the first section deflects in a direction parallel to the reference plane.

3. The light activated piezoelectric converter of claim 2 where the vane has a length L where the length L extends from the proximate end of the first section to the distal end of the first section and where the length L is parallel to the reference plane, and where the vane has a height H perpendicular to the reference plane and a width W perpendicular to the height H and perpendicular to the length L, and where the width W is greater than the height H, and the length L is at least 5 times greater than the height H.

4. The light activated piezoelectric converter of claim 1 further comprising an atmosphere surrounding the vane, and where the first surface and the second surface are separated by the portion of the common boundary by a distance less than or equal to 10 mean free paths of the atmosphere.

5. The light activated piezoelectric converter of claim 3 further comprising an energy harvesting circuit in electrical communication with the first electrode and the second electrode where the energy harvesting circuit comprises a storage capacitor and where the energy harvesting circuit is configured to charge the storage capacitor utilizing a voltage between the first electrode and the second electrode and configured to discharge the storage capacitor when a voltage limit is present across the storage capacitor.

6. The light activated piezoelectric converter of claim 5 where the energy harvesting circuit comprises an AC/DC rectifier in electrical communication with the first electrode and the second electrode, and where the AC/DC rectifier is configured to charge the storage capacitor.

7. The light activated piezoelectric converter of claim 1 further comprising:
   an atmosphere surrounding the vane;
   a radiant flux impinging the first surface and the second surface, and the radiant flux generating a first temperature on the first surface and a second temperature on the second surface, where the first temperature is greater than the second temperature, and the first temperature and the second temperature generating a temperature gradient and generating a thermal creep force in a direction from the first surface to the second surface and parallel to the first surface and the second surface over the portion of the common boundary, and the thermal creep force generating a deflection of the vane; and
   the deflection of the vane generating a stress on the piezoelectric material and the piezoelectric material generating a voltage between the first electrode and the second electrode.

8. The light activated piezoelectric converter of claim 7 where the atmosphere surrounding the vane comprises air at a pressure of at least 80 kPa, and where a total width W is equal to a first section width added to a second section width, where the first section width is a dimension of the first surface perpendicular to the portion of the common boundary and the second section width is a dimension of the second surface perpendicular to the portion of the common boundary, and where the total width is less than 100 microns.

9. The light activated piezoelectric converter of claim 1 further comprising:
   an axle having a longitudinal axis where the axle is coupled to the foundation; and
   a second vane in mechanical contact with the axle and configured to revolve around the longitudinal axis of the axle.

10. The light activated piezoelectric converter of claim 9 further comprising:
    an atmosphere surrounding the vane;
    a radiant flux impinging the first surface of the vane and the second surface of the vane, and the radiant flux generating a first temperature on the first surface of the vane and a second temperature on the second surface of the vane, where the first temperature is greater than the second temperature, and the first temperature and the second temperature generating a temperature gradient and generating a thermal creep force in a direction from the first surface of the vane to the second surface of the vane and parallel to the first surface of the vane and the second surface of the vane over the portion of the common boundary, and the thermal creep force generating a deflection of the vane;
    the radiant flux impinging the first surface of the second vane and the second surface of the second vane, and the radiant flux generating a third temperature on the first surface of the second vane and a fourth temperature on the second surface of the second vane, where the third temperature is greater than the fourth temperature, and the third temperature and the fourth temperature generating a second temperature gradient and generating a second thermal creep force in a direction from the first surface of the second vane to the second surface of the second vane, and the second thermal creep force generating a revolution of the second vane around the longitudinal axis, and the second vane positioning between the radiant flux and vane during at least some part of the revolution around the longitudinal axis; and
    the deflection of the vane generating a stress on the piezoelectric material and the piezoelectric material generating a voltage between the first electrode and the second electrode.

11. A system for generating a voltage using a radiant flux comprising:
    a light activated piezoelectric converter, where the light activated piezoelectric converter comprises:
       a foundation;
       a vane comprising:
          a first section comprising a first surface between a proximate end of the first section and a distal end of the first section, where the proximate end of the first section is coupled to the foundation, and where the first surface has a first emissivity; and
          a second section comprising a second surface between a proximate end of the second section and a distal end of the second section, where the proximate end of the second section is coupled to the foundation, and where the second surface has a second emissivity, where the first emissivity minus the second emissivity is equal to at least 0.1, and where the second surface borders the first surface over a common boundary and the second surface is co-planer with the first surface over a portion of the common boundary;
       a piezoelectric material coupled to a single section of the vane, where the single section is either the first section of the vane or the second section of the vane;
       a first electrode in electrical contact with the piezoelectric material; and
       a second electrode in electrical contact with the piezoelectric material;
    an atmosphere surrounding the light activated piezoelectric converter; and
    the radiant flux impinging the first surface and the second surface, and the radiant flux generating a first temperature on the first surface and a second temperature on the second surface, where the first temperature is greater than the second temperature, and the first temperature and the second temperature generating a temperature gradient and generating a thermal creep force in a direction from the first surface to the second surface, and the thermal creep force generating a deflection of the vane, and the deflection of the vane generating a stress on the piezoelectric material and the stress on the piezoelectric material generating a voltage between the first electrode and the second electrode.

12. The system of claim 11 where the vane has a length L from the proximate end of the first section to the distal end of the first section, and where the first surface has a first width perpendicular to the length L and the second surface has a second width perpendicular to the length L, and where the common boundary has a boundary width perpendicular to the length L, and where a total width W is equal to the first width added to the second width added to the boundary width, where the total width W is greater than 5 times the mean free path of the atmosphere surrounding the light activated piezoelectric converter.

13. The system of claim 12 where the vane has a height H where the height H is a dimension of the first section perpendicular to the first width and perpendicular to the length L, and where the height H is less than the total width W, and where the length L is at least 5 times greater than the height H.

14. The system of claim 13 where the total width W is less than 100 microns and where the atmosphere surrounding the vane comprises air at a pressure of at least 80 kPa.

15. The system of claim 14 further comprising an energy harvesting circuit in electrical communication with the first electrode and the second electrode and the energy harvesting circuit charging a storage capacitor using the voltage between the first electrode and the second electrode and generated by the stress on the piezoelectric material.

16. A method of generating a voltage using a radiant flux comprising:
   surrounding a light activated piezoelectric converter with an atmosphere, where the light activated piezoelectric converter comprises:
      a foundation;
      a vane comprising:
         a first section comprising a first surface between a proximate end of the first section and a distal end of the first section, where the proximate end of the first section is coupled to the foundation, and where the first surface has a first emissivity; and
         a second section comprising a second surface between a proximate end of the second section and a distal end of the second section, where the proximate end of the second section is coupled to the foundation, and where the second surface has a second emissivity, where the first emissivity minus the second emissivity is equal to at least 0.1, and where the second surface borders the first surface over a common boundary and the second surface is co-planer with the first surface over a portion of the common boundary;
      a piezoelectric material coupled to a single section of the vane, where the single section is either the first section of the vane or the second section of the vane;
      a first electrode in electrical contact with the piezoelectric material; and
      a second electrode in electrical contact with the piezoelectric material
   directing the radiant flux toward the first surface and the second surface of the vane;
   generating a first temperature on the first surface and a second temperature on the second surface using the radiant flux, where the first temperature is greater than the second temperature, thereby generating a temperature gradient across the vane;
   establishing a thermal creep force from the first surface to the second surface using the temperature gradient and the gaseous atmosphere surrounding the vane where the thermal creep force is parallel to the first surface and parallel to the second surface;
   generating a deflection of the vane using the thermal creep force;
   generating a stress on the piezoelectric material using the deflection of the vane; and
   allowing the stress on the piezoelectric material to develop a voltage between the first electrode and the second electrode in electrical contact with the piezoelectric material.

17. The method of claim 16 further comprising:
providing the vane with a length where the length L extends from the proximate end of the first section to the distal end of the first section;
providing the vane with a total width W greater than 5 times the mean free path of the atmosphere surrounding the light activated piezoelectric converter, where the total width W is equal to a first width added to a second width added to a boundary width, where the first width is a dimension of the first surface perpendicular to the length L, second width is a dimension of the second surface perpendicular to the length L, and the boundary width is a dimension of the common boundary perpendicular to the length L;
providing the vane with a height H, where the height H is a dimension perpendicular to the length L and perpendicular to the total width W, and where the length L is the length L is at least 5 times greater than the height H.

18. The method of claim 17 further comprising:
providing a total width W of less than 100 microns; and
providing the atmosphere where the atmosphere comprises air at a pressure of at least 80 kPa.

* * * * *